United States Patent [19]

Jansen

[11] Patent Number: 4,612,207
[45] Date of Patent: * Sep. 16, 1986

[54] APPARATUS AND PROCESS FOR THE FABRICATION OF LARGE AREA THIN FILM MULTILAYERS

[75] Inventor: Frank Jansen, Walworth, N.Y.

[73] Assignee: Xerox Corporation, Stamford, Conn.

[*] Notice: The portion of the term of this patent subsequent to Aug. 21, 2001 has been disclaimed.

[21] Appl. No.: 691,344

[22] Filed: Jan. 14, 1985

[51] Int. Cl.⁴ .............................................. C23C 13/08
[52] U.S. Cl. .................................... 427/39; 118/692;
118/712; 118/723; 118/725; 118/730; 118/900;
427/74; 427/86; 427/255.1; 427/255.2;
427/255.3; 427/255.5; 427/294
[58] Field of Search ............... 118/712, 723, 730, 725,
118/900, 692; 427/39, 294, 255.1, 256.2, 255.3,
255.5, 74, 86

[56] References Cited

U.S. PATENT DOCUMENTS

| | | | |
|---|---|---|---|
| 2,103,623 | 12/1937 | Kott | 250/27.5 |
| 4,142,004 | 2/1979 | Hauser, Jr. et al. | 427/39 |
| 4,342,631 | 8/1982 | White et al. | 204/192 N |
| 4,394,401 | 7/1983 | Shioya et al. | 427/39 |
| 4,404,076 | 9/1983 | Nakagawa et al. | 204/164 |
| 4,422,407 | 12/1983 | Bessot et al. | 118/723 |
| 4,423,133 | 12/1983 | Kanbe et al. | 427/39 |
| 4,438,154 | 3/1984 | Kato et al. | 427/39 |
| 4,438,188 | 3/1984 | Shimatani et al. | 430/128 |
| 4,466,380 | 8/1984 | Jansen et al. | 118/712 |

Primary Examiner—John D. Smith
Assistant Examiner—Janyce A. Bell
Attorney, Agent, or Firm—E. O. Palazzo

[57] ABSTRACT

Disclosed is an apparatus for affecting the preparation of thin film transistor arrays comprised of a chamber means with a gas inlet means, and a gas exhaust means, first rotatable polygon electrode means, second stationary counterelectrode means of cylindrical shape situated coaxially with the first electrode means, and substrate means to be coated present on the first polygon electrode means.

26 Claims, 4 Drawing Figures

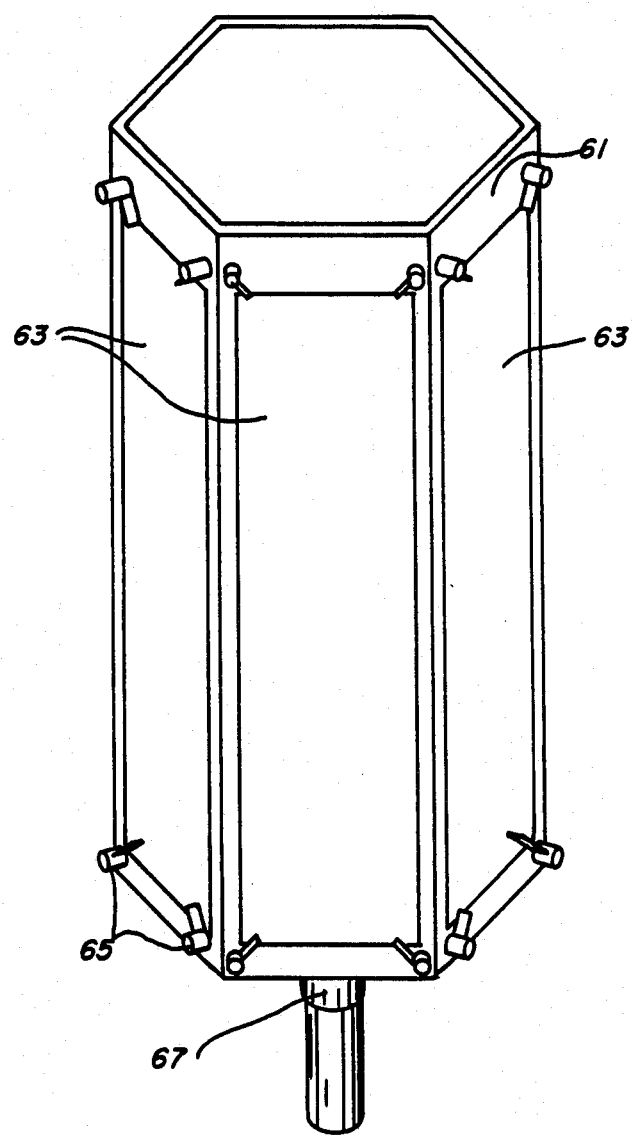

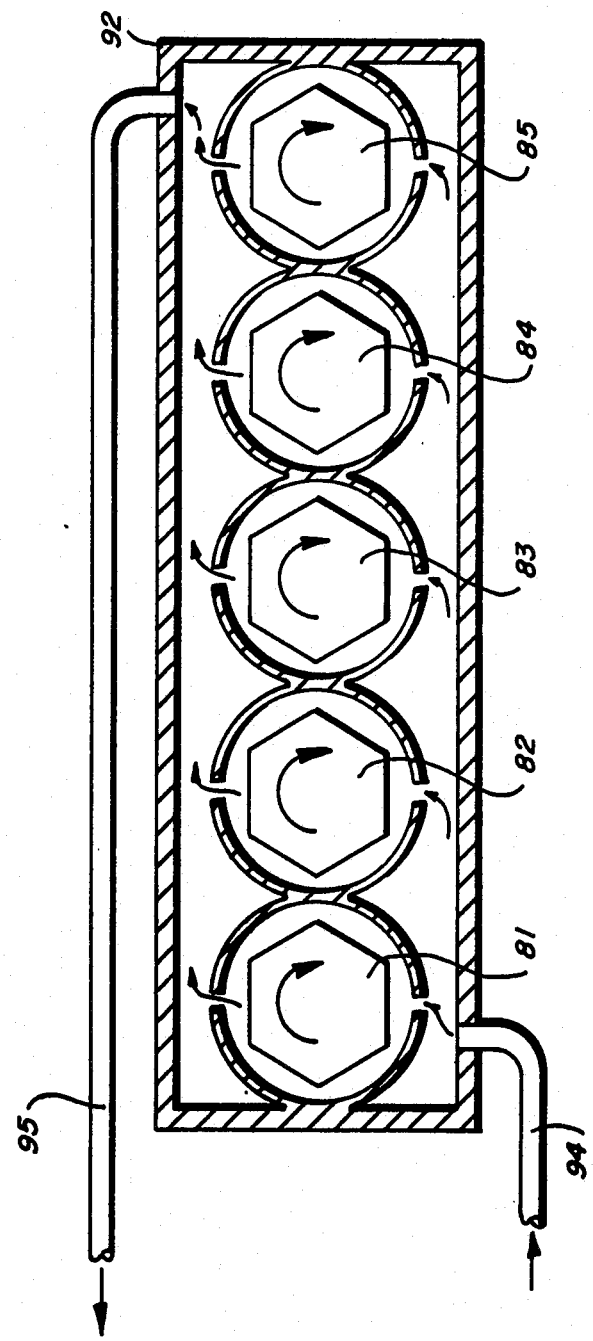

APPARATUS AND PROCESS FOR THE FABRICATION OF LARGE AREA THIN FILM MULTILAYERS

BACKGROUND OF THE INVENTION

This invention generally relates to a process and apparatus, and more specifically, the present invention is directed to a process and apparatus for preparing large area thin film multilayers for thin film transistors, which can be used, for example, as electrical current switches in liquid crystal displays; in optical sensor arrays, and in multiplexed output devices. Large area thin film fabrication is accomplished in accordance with the present invention by effecting the deposition of layered amorphous hydrogenated silicon compositions on a polygon electrode situated in vacuum chamber, wherein appropriate gas source materials are subjected to decomposition in an electrical discharge subsequent to causing these gases to flow toward the polygon, preferably in a crossward direction thereof, or in a direction orthogonal to the substrate axis.

There is described in a copending application, U.S. Ser. No. 456,935/83, the disclosure of which is totally incorporated herein by reference, an apparatus for the preparation of semiconducting and photoelectric devices, inclusive of amorphous hydrogenated silicon imaging members. In one embodiment of the invention described in the copending application, there is illustrated an apparatus for preparing amorphous hydrogenated silicon photoconductive devices comprised in operative relationship of a first electrode substrate means, containing heating elements therein, a counterelectrode means, a receptacle, or vacuum chamber, for housing the first electrode means and the counterelectrode means, with the first electrode means containing the substrate or workpiece, which may be in the form of cylindrical member or drum, an entrance means and an exhaust means in the receptacle for a silane gas. In a variation of this apparatus, a plurality of modules consisting of a first electrode means with heating elements therein, a second counterelectrode means and substrates on the first electrode means, can be arranged in a single receptacle or chamber which contains one gas inlet and one gas exhaust exit. The process and apparatus of the present invention, while similar to that described in the copending application, differs therefrom with respect to the selection of a polygon electrode, which can be used as anode or cathode during the excecution of the process; and the use of a discharge shield for anodic operation.

There is also disclosed in a copending application, U.S. Ser. No. 548,117/83, layered photoresponsive devices comprised of amorphous hydrogenated silicon as a charge carrier transport layer, situated between a supporting substrate, and a thin trapping layer of heavily doped amorphous hydrogenated silicon and overcoating layers of, for example, silicon nitride, silicon carbide, amorphous carbon, and the like on top of the trapping layer. In a specific embodiment, described in this copending application, there is illustrated a photoresponsive device comprised in the order stated of (1) a supporting substrate, (2) a carrier transport layer comprised of uncompensated or undoped amorphous hydrogenated silicon, or amorphous hydrogenated silicon slightly doped with p or n type dopants such as boron or phosphorous, (3) a trapping layer comprised of amorphous hydrogenated silicon which is heavily doped with p or n type dopants such as boron or phosphorous, and (4) a top overcoating layer of silicon nitride, silicon carbide, or amorphous carbon, wherein the top overcoating layer can be optionally rendered partially conductive as illustrated hereinafter. The imaging member of this copending application, the disclosure of which is totally incorporated herein by reference, can be prepared as described in copending application U.S. Ser. No. 456,935.

Additionally, there is described in the prior art methods for obtaining amorphous hydrogenated silicon by glow discharge processes. In this process, the vapor deposition of a silane gas occurs by causing the gas to decompose between two electrodes, one of which has a substrate contained thereon. As electrical power is applied to the electrodes, the silane gas decomposes into reactive silicon-hydrogen species, which will deposit as a solid film on both electrodes. The presence of hydrogen can be of critical importance since it tends to partially coordinate with the dangling bonds in the silicon, as the mono, di, and tri-hydrides, thereby serving to passivate these bonds.

In another known process, amorphous hydrogenated silicon can be prepared by a sputtering technique, wherein a substrate is attached to one electrode, and a target of silicon is placed on a second electrode. These electrodes are connected to a high voltage power supply and a gas, which is usually a mixture of argon and hydrogen, is introduced between the electrodes to provide a medium in which a glow discharge, or plasma can be initiated, and maintained. The glow discharge provides ions which strike the silicon target, and cause the removal by momentum transfer of mainly neutral target atoms. These atoms subsequently condense as a thin film on the substrate electrode. Also, the glow discharge functions to activate the hydrogen, causing it to react with the silicon, and be incorporated into the deposited silicon film. The activated hydrogen also coordinates with the dangling bonds of the silicon to form mono, di, and tri-hydrides.

There is also known, an apparatus and process for preparing amorphous hydrogenated silicon films on a substrate, which involves means for directing and accelerating an ion beam from a plasma toward a sputtering target contained within a chamber, which chamber also contains a shield means having a low sputtering efficiency compared to the sputtering target. The shield means is situated between stray ion beams and the vacuum chamber surface. More specifically, this ion beam process involves producing semiconductive films on a substrate comprising generating a plasma, directing and accelerating an ion beam of the plasma toward a sputtering target, contained in a vacuum chamber at reduced pressure, shielding the vacuum chamber surface from stray ion beams, whereby sputtering of the vacuum chamber surface by the plasma is minimized; followed by sputtering the target with the ion beam, and collecting the sputtered target material as a film on the substrate. The substrate is spatially separated from the plasma generating process and the sputtering process.

Additionally, there is disclosed in U.S. Pat. No. 4,265,991 an amorphous hydrogenated silicon photoconductor. This patent describes several processes for preparing amorphous hydrogenated silicon. In one process, there is prepared an electrophotographic photosensitive member which involves heating the electrophotographic member contained in a chamber to a temperature of 50° C. to 350° C., introducing a gas containing hydrogen into the deposition chamber, causing an electrical discharge in the space of the deposition chamber, in which a silicon compound is present, by electric energy to ionize the gas, followed by depositing amorphous hydrogenated silicon on the electrophotographic substrate at a rate of 0.5 to 100 Angstroms per second by utilizing an electric discharge, while increasing the temperature of the substrate, thereby resulting in an amorphous hydrogenated silicon photoconductive layer of a predetermined thickness.

Moreover, several methods have been described for the plasma deposition of various substances, inclusive of amorphous hydrogenated silicon and silicon nitride on flat substrates. In many of these methods the substrates are maintained in a stationary position with respect to the gas flow and the counterelectrode. In some of these processes gas depletion effects are substantially avoided by using a tapered or a central exhaust, reference the known Reinberg reactor. While this type of reactor is extensively used for etching and deposition processes, its use thereof for scaleup purposes is not practical in view of the gas depletion effects which change non-linearly with gas flowrate. With the apparatus of the present invention the deposition geometry is desirably linearly scaleable to arbitrarily large throughputs and enables the yielding of uniform film thicknesses on large substrates. Thus the geometry of the apparatus of the present invention is linearly scaleable in the direction of the axis of the polygon electrode, and by the number of polygon electrodes, with associated counterelectrodes contained in the same vacuum system.

Other types of large area flat plate reactors select sample trays which are linearly moved through a reaction zone. These reactors suffer from the disadvantage of mechanical complexity. Therefore, in these reactors the mechanical transmission mechanism that moves the substrate tray is inevitably undesirably covered with the material which is deposited in the reaction zone. The mechanical motion involved causes some fraction of the deposited material to spall off during the process. It is these loose particles which often result in coating defects, and reduce the process yield. In yet another type of reactor, a long sheet of substrate material is transferred from roll to roll through the reaction zone. Although this reactor may not suffer from the aforementioned flake problem, its application is limited to the use of flexible substrates.

SUMMARY OF THE INVENTION

It is an object of the present invention to provide an apparatus and process for the preparation of large area thin film multilayers for use as thin film transistors.

It is a further object of the present invention to provide an apparatus and process for the glow discharge deposition of large area multilayered structures on a rotating polygon, or multifacet electrode.

In a further object of the present invention there is provided an improved apparatus for obtaining thin film transistor arrays useful as switching devices in for example liquid crystal displays and optical sensor arrays, by introducing in sequence appropriate gases into a reaction chamber with a polygon central electrode and a counterelectrode which surrounds the central electrode.

In an additional object of the present invention there is provided an improved apparatus for obtaining thin film transistor arrays of uniform thicknesses at high deposition rates, which apparatus is simple in design and economically attractive.

These and other objects of the present invention are accomplished by the provision of a process and apparatus for obtaining thin film transistor arrays, the apparatus being comprised of a first polygon electrode, or multifacet electrode substrate means, with heating elements therein, a second counterelectrode means, which preferably functions as a cathode, a receptacle, or vacuum chamber, for housing the first polygon electrode means, and the counter electrode means, with the first polygon electrode means containing thereon substrates anchored thereto, and a gas entrance means and an exhaust means in the receptacle. In another embodiment of the present invention, there is provided an apparatus and process for generating thin film transistor arrays wherein a plurality of polygon electrode anode means, associated with counterelectrode means are situated in one receptacle.

In another specific embodiment of the present invention there is provided an apparatus for effecting the preparation of thin film transistor arrays comprised of a first rotatable polygon electrode means, a second stationary counterelectrode means of cylindrical shape situated coaxially with the first electrode means, a receiving means for the electrode means, substrate means to be coated present on the first polygon electrode means, a gas inlet means, and a gas exhaust means.

In a further specific embodiment of the present invention there is provided a process for preparing thin film transistor arrays which comprises providing a receptacle containing therein a first polygon electrode means, and a second counterelectrode means, with substrates adhered to the surface of the polygon electrode means, heating the polygon electrode means with heating elements contained therein while causing the first electrode means to axially rotate, introducing in sequence the appropriate silane gases into the reaction vessel, preferably at a right angle with respect to the polygon means, followed by applying a current to the polygon means, and to the second electrode means, wherein the gases introduced are decomposed causing component deposition thereof on the substrates.

DESCRIPTION OF THE PREFERRED EMBODIMENTS

The process and apparatus of the present invention and various alternative embodiments will now be described with reference to the following figures wherein:

FIG. 3 illustrates a polygon electrode that can be selected for the process and apparatus of the present invention.

FIG. 4 illustrates the arrangement of a plurality of polygon electrode modules in a single vacuum chamber.

Figure 1:
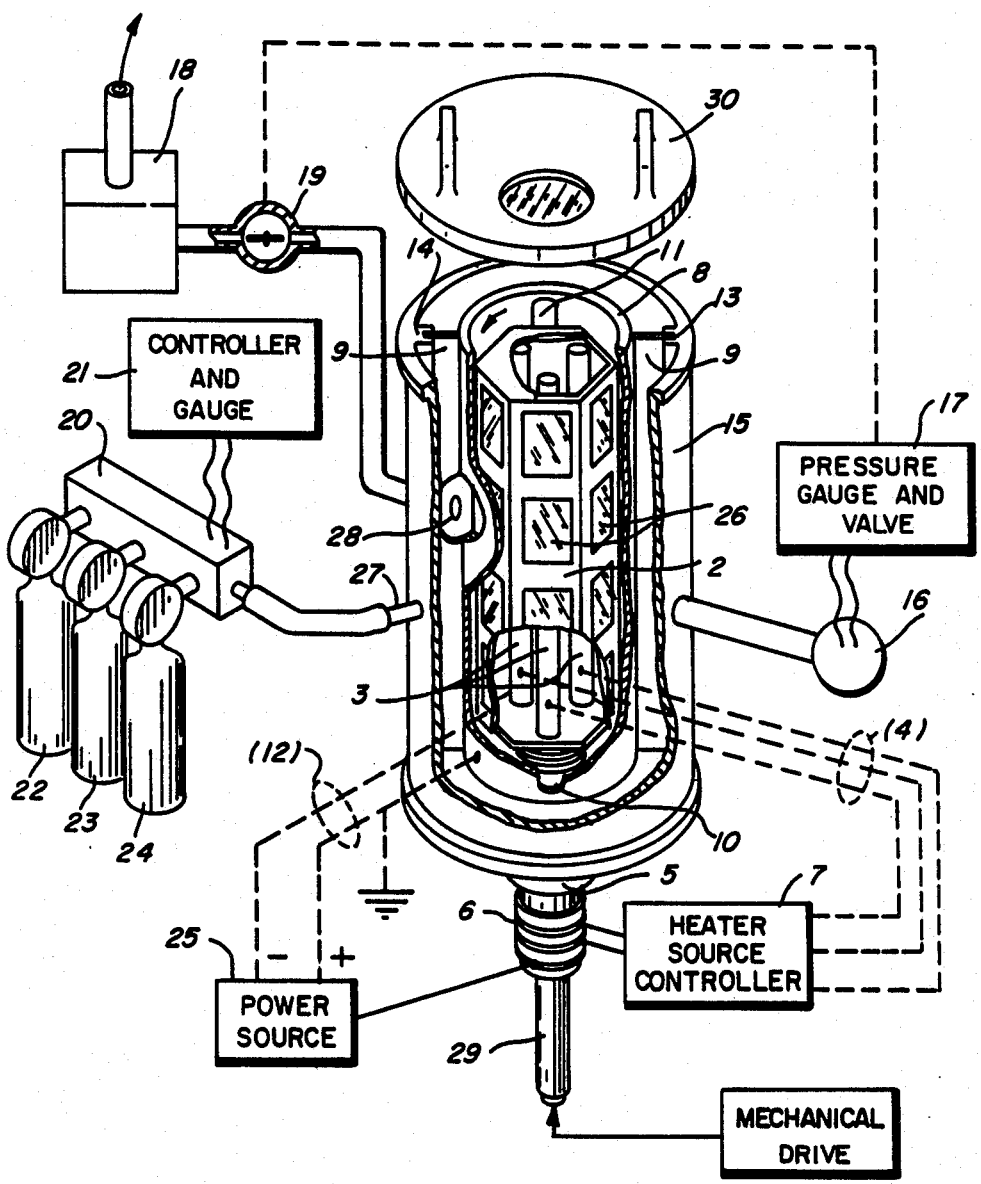
FIG. 1 is a schematic view of the cathodic apparatus and process of the present invention.

Illustrated in FIG. 1 is the cathodic apparatus for the process of the present invention comprising a polygon first electrode means 2, which is electrically isolated from ground, and rotates in the direction indicated by the arrow, secured on an electrically insulating hollow shaft 29, radiant heating elements 3 situated within the first electrode means 2, connecting wires 4, and 12, a rotary vacuum feedthrough 5 and slip ring assembly 6, a heating source 7, a counterelectrode means 8 which is electrically grounded, with flanges thereon 9, and vertical openings 10 and 11, receptacle or chamber means 15, containing as an integral part thereof receptacles 13 and 14 for flanges 9 for mounting the module in the chamber 15, a capacitive manometric vacuum sensor 16. a gauge 17, a vacuum pump 18, with a throttle valve 19, mass flow controllers 20, a gauge and set point box 21, gas pressure vessels 22, 23 and 24, and an electrical power source means 25, connected to the polygon electrode means 2, and the second counterelectrode means 8. There is adhered to the polygon, and situated on the surface thereof substrates 26. The chamber 15 contains an entrance means 27, for the source gas material, and an exhaust means 28 for the unused gas materials, and a cover means 30.

Figure 2:
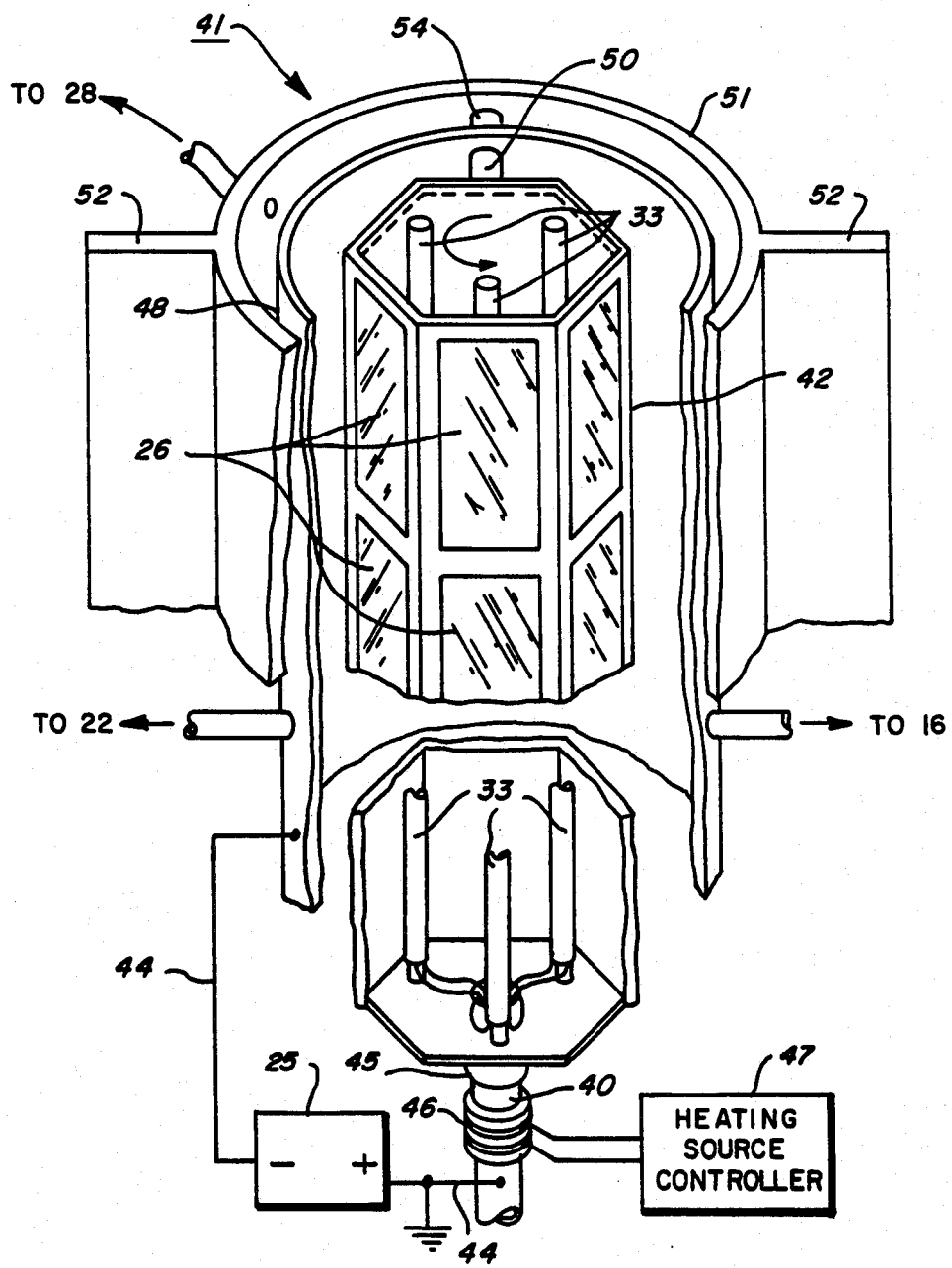
FIG. 2 is a schematic view of the anodic apparatus and process of the present invention.

Illustrated in FIG. 2 is the anodic apparatus for the process of the present invention, generally designated 41, comprising a polygon first electrode means 42 which is electrically grounded, rotating in the direction indicated by the arrow, secured on a hollow shaft 40, radiant heating elements 33 situated within the first electrode means 42, connecting wires 44, a rotary vacuum feedthrough 45 and slip ring assembly 46, a heating source 47, a counterelectrode means 48 which is electrically isolated from ground with vertical openings 50, and 54, surrounded by an optional electrically grounded discharge shield 51 with flanges thereon 52, and glass substrates 26. Other components of this apparatus are as illustrated with reference to FIG. 1. This anode configuration differs from the cathode of FIG. 1, in that the polarity of the polygon means is positive, instead of negative; the polarity of the counterelectrode is negative instead of positive: and there is a grounded discharge shield with slots and flanges thereon, which surrounds the counterelectrode in the device of FIG. 2.

Generally, in operation, the chamber 15 is evacuated by vacuum pump 18, to an appropriate pressure corresponding to the pressure desired by manually adjusting gauge 17, this pressure being measured in the chamber by the vacuum sensor 16. The pressure in the chamber 15 is automatically regulated so as to correspond to the setting specified at gauge 17 by the position of the throttle valve 19. Subsequently, appropriate gases and gas mixtures consisting of, for example, ammonia, silane, nitrous oxide, phosphine and diborane originating from one of the gas vessels 22, 23, or 24 are introduced sequentially into the chamber 15 through entrance means 27, the flow of these gases being controlled by the mass flow controllers 20. The gases, introduced into the entrance 27, are caused to flow in a direction perpendicular to or at right angles to the axis of the polygon electrode by the shape of the counterelectrode arrangement 8, for the cathodic apparatus. Prior to the introduction of the precursor gases, the polygon electrode means is caused to rotate by a motor, not shown, and electrical power is supplied to the radiant heating elements 3 by heating source 7. Generally, sufficient power is applied from the heating source to maintain the substrates at a temperature of from about 100° C. to about 500° C. and preferably at a temperature of from about 250° C. to 325° C. Current is applied to the first electrode means and the second counterelectrode means by an electrical power source 25. For the cathodic apparatus, the voltage is applied to the polygon electrode 2, and the counterelectrode 8 is electrically grounded. For the anodic apparatus, the voltage is applied to the counterelectrode 48, and the polygon electrode 42 is electrically grounded. The spatial extent of the glow discharge is in the anodic apparatus optionally controlled by the use of the grounded discharge shield 51, which is placed in close proximity to the counterelectrode 48. Both radio frequent, (R.F.) and D.C. voltages, or other appropriate voltages providing the objectives of the present invention are achieved, can be applied to the apparatuses. When D.C. voltages are applied, they are preferably negative with respect to ground, enabling a more stable discharge to result. In this situation, glow discharge is sustained between the counterelectrode and the parts of the polygon which are not covered with insulating substrate material. The electrical field created between the polygon electrode means and the second counterelectrode means causes the gases entering this field to be decomposed by the glow discharge whereby there results on the substrates in sequence an electrically insulating layer of, for example, silicon nitride, silicon oxide, aluminum oxide, or an organo silicon compound, followed by a layer of amorphous hydrogenated silicon (a-Si:H), and an optional top layer of silicon nitride, silicon oxide, aluminum oxide or an organo silicon compound. Unused gases exit at exhaust opening 28 in view of the pressure differential maintained by the vacuum pump 18, which gases are subsequently discarded. The gauge and set point box 21 controls the amount of gases introduced into gas inlet 27 through the mass flow controllers 20, this amount generally being up to 5 liters per minute, or from about 2 cubic centimeters to about 200 standard cubic centimeters per minute at standard temperature and pressure. As a result there is formed a thin film or thin film multilayers on the substrate in a thickness of about 25 microns to about 5,000 microns, and preferably in a thickness of from about 100 microns to about 1,000 microns.

When the polygon substrates are not electrically conductive, they can be covered with an electrically conductive substance prior to insertion into the apparatuses of the present invention. As examples, thin metal films of chromium, molybdenum, and aluminum were found to be useful for this application. These films may be pre-patterned on the substrate for the purpose of forming a plurality of devices, or an array, on the same substrate. The metal film is usually designated as a gate electrode or gate electrode array. A silicon nitride, silicon oxide, aluminum oxide, or an organo silicon compound layer can then be deposited thereover in a thickness of from about 0.01 to about 10 microns, and preferably in a thickness of from about 0.1 microns to about 0.5 microns, by the admission of the appropriate precursor gases to the apparatus of the present invention. This layer serves the purpose of electrically insulating the gate electrodes from the active silicon layer and is generally designated as the gate insulator. An amorphous hydrogenated silicon layer in a thickness of about 0.01 microns to about 10 microns, and preferably in a thickness of from about 0.1 microns to about 0.5 microns, is subsequently deposited. It is in this layer that the actual transport of the charge carriers occurs. Also, the rate of transport of these carriers can be regulated by the application of voltages to the gate electrode through the action of electric fields which originate from this electrode and are transmitted through the gate insulator and penetrate the silicon layer. Finally, a top layer of silicon nitride, silicon oxide, aluminum oxide, or an organo silicon compound can optionally be deposited thereover, in a thickness of about 0.01 microns to about 1.0 microns, and preferably in a thickness of from about 0.01 microns to about 0.3 microns, for the purpose of protection and passivation of the underlying layers. In further fabrication steps, known in the art as photolithographic delineation processes, the passivation layer, or top overcoating, is partially removed by, for instance, chemical etching or physical sputtering processes to provide a metal film, which is subsequently deposited allowing electrical contact to the underlying amorphous silicon layer. Thus electrodes are formed in pairs on the amorphous silicon, which electrodes are known as the source and the drain. Therefore, there is formed a three terminal device, or thin film transistor which can be used for the purpose of an electrical current switch.

More specifically, and related to the deposition of the thin film multilayer in the apparatuses of the present invention, glass substrates are loaded into the deposition chamber by affixing these to the faces of the polygon electrode. Thereafter, chamber 15 is evacuated to a base pressure of less than 1 mTorr (milliTorr) followed by heating the polygon electrode to a temperature of about 250° C., by heating elements 3. Subsequently, reactant gases are introduced into the chamber 15 from gas pressure vessels 22, 23 and 24. Thus, for the deposition of silicon nitride layers, mixtures of silane and ammonia are admitted to the chamber, typically in a ratio of 3:1 to 10:1 ammonia to silane. For the deposition of silicon oxide layers, mixtures of silane and nitrous oxide are admitted to the apparatus, typically in a ratio of 3:1 to 7:1, nitrous oxide to silane. Also, to affect the deposition of aluminum oxide layers, mixtures of aluminum trichloride and nitrous oxide are introduced to the apparatus, typically in a ratio of 20:1 nitrous oxide to aluminum trichloride; and for the deposition of organosilicon layers, organosilicon compounds such as mono- or di-phenyl silane or methyl-phenyl silanes are directed to the deposition chamber. The flow rate of these gases is controlled by the mass flow controller 20, which flow rate is equivalent to the numerical readout specified in the gauge and set point box 21. Practical flow rates are of the order of 100 sccm for a single polygon reactor with six facets which are each 20 inches long and 5 inches wide. The pressure of the gas or gas mixtures in the vacuum chamber 15 is controlled, as desired, with the vacuum sensor 16, vacuum gauge 17, vacuum pump 18 and throttle valve 19, by setting the pressure desired at gauge 17. This pressure generally ranges from 100 to about 5,000 mTorr, however, in the operational sequence being illustrated, the pressure is maintained at 250 mTorr for all the layers. Electrical power, either A.C. or R. F., is usually applied from the electrical power source 25 at a power level of up to 100 watts for a single polygon reactor. At such a power level, the deposition time is about 30 minutes for each layer of a thickness of 3,000 Angstroms. Further, between the different layers of the deposition chamber, thorough evacuation is affected to avoid cross-contamination effects.

Thereafter, the system is inactivated and the substrates with the multilayered gate electrode pattern, the gate insulator film, the amorphous hydrogenated silicon film, and the optional passivation layer are removed from the chamber 15. Should it be desired to prepare other transistor arrays, new substrates are then inserted into the chamber 15 and affixed to the polygon, followed by reactivation of the system described.

The polygon electrode means is further illustrated with reference to FIG. 3. More specifically, the polygon contains surfaces 61, having adhered thereto substrates 63 by adhering means 65. The polygon is comprised of up to 50 facets of preferably stainless steel, heli-arced together in a leak-tight fashion, where the size of the facet is about the size of the substrate on which the film multilayer is to be deposited. An insulator 67 is commonly placed between the welded facet assembly and the hollow shaft through the rotary vacuum feed-through for the purpose of heat insulation of the rotary vacuum feed-through and electrical insulation for the cathodic apparatus.

In FIG. 4 is illustrated a further embodiment of the present invention which is useful for the production of a number of thin film transistor arrays. A plurality of electrode arrangements 81, 82, 83, 84 and 85, which are equivalent to the polygon of FIG. 1, are situated in the same vacuum vessel 92. A gas inlet 94, and exhaust manifold, 95, is used to distribute the gas flow evenly over the different modules. The operation of this multimodule reactor is substantially the same as the operation as described for the single module reactor of FIG. 1. Also the flow rate and electical power parameters are linearly scaleable, for example the single module parameters are multiplied by the number of modules in the large throughput reactor. The substrate temperature and the pressure parameters are not changed from those as described in reference to FIG. 1 when the same material properties are required.

The flow pattern of the precursor gases with respect to the electrode geometry is an important aspect of the present invention, this flow being specified herein as a crossflow. This crossflow direction provides for the uniform deposition of the amorphous hydrogenated silicon and the insulating films in a uniform thickness on the substrate adhered to the polygon electrode means.

The first electrode means can be of any one of a different number of configurations, but preferably is in the form of a polygon, with an overall length of from about 9 inches to about 20 inches, an overall average diameter of from about 3 inches to about 15 inches; and a number of adhering facets of from between 2 and about 50. Generally, this electrode means, which is connected to a voltage source, is a member comprised of numerous suitable materials inclusive of stainless steel, steel, invar, aluminum, ceramic materials or glassy materials, and the like, with stainless steel being preferred.

Electric fields between the electrodes are derived from a direct current source or from an alternating current source such as a radio frequent source, (R.F.). Also, the field strength can be varied as desired, providing the objectives of the present invention are accomplished.

The chamber means 15 serves as a container for the module and is generally comprised of stainless steel sealed with demountable covers 30, which serve as an access means. This chamber container is of a sufficient dimension so as to allow the electrodes to reside therein. Generally, the chamber container is of a height of from about 10 inches to about 30 inches, and has a width of from about 5 inches to about 17 inches whereas the length of the chamber is determined by the number of electrode modules consisting of polygon anode means and counterelectrode means, therein.

Gases introduced into the reaction chamber include $SiH_4$, $Si_2H_6$, $NH_3$, $N_2O$, $Al(CH_3)_3$, $AlCl_3$, and gaseous organo-silane compounds; and further, the silane gases may be mixed with doping materials such as diborane $B_2H_6$ and/or phosphine $PH_3$. The boron dopant is for the primary purpose of producing a p-type material, while the phosphine gas allows the production of an n-type material. With further regard to the crossflow direction the gases are introduced into the reaction chamber, preferably at approximately a 90° angle relative to the polygon anode, through the slots in the shield and the counterelectrode.

The thin film transistor arrays generated can then be suitably treated, such as for example, by lithography enabling the preparation of liquid crystal displays, optical sensors, and particularly raster input scanners and output devices useful in imaging and printing systems.

The invention will now be described in detail with respect to specific preferred embodiments thereof, it being understood that these Examples are intended to be illustrative only and the invention is not intended to be limited to the materials, conditions or process parameters recited herein. All parts and percentages are by weight unless otherwise indicated.

EXAMPLE I

Six glass substrates of dimensions 5" by 12" with predeposited gate electrode patterns were adhered with clips to a polygon electrode, as illustrated in FIGS. 1 and 2. The apparatus of FIG. 1 was then evacuated to a pressure of less than $1 \times 10^{-4}$ Torr, and the combined inlet and outgassing rate was typically smaller than 0.1 standard cubic centimeter per minute. The polygon rotation was started at a speed of one rotation per minute. Thereafter, the polygon with glass substrates thereon was heated up to 250° C. over a period of 30 minutes. A mixture of 5:1 ammonia to silane gas, available from Air Products, was introduced in the apparatus of FIG. 1 at flow rates of 100 standard cubic centimeter per minute. The roots/mechanical pump combination of the apparatus was throttled so as to produce a pressure of 250 mTorr at this flow rate. The pressure was held constant by a closed loop pressure control apparatus situated between the capacitance manometer and the throttle valve. Discharge was initiated in the annular space situated between the polygon electrode, and a second steel counterelectrode, by applying alternating current of a frequency of 13.56 MHz and about 300 volts peak to peak amplitude to these electrodes. The average distance between the polygon and the second electrode was about 1 inch.

There was deposited on the glass substrates after 30 minutes in a thickness of 0.3 microns silicon nitride. Thereafter, and following the introduction of silane gas, there was deposited on the silicon nitride amorphous hydrogenated silicon in a thickness of 0.3 microns. Subsequently, and following the introduction of the 5:1 ammonia-silane gas mixture into the reaction chamber, there was deposited on the amorphous hydrogenated silicon layers in a thickness of 0.3 microns silicon nitride. The apparatus was then deactivated by turning off the supply voltages and closing the gas valves. Subsequently, the coated glass substrates were removed from the polygon. The resulting thin film multilayers, with supporting glass substrates in a thickness of 1.5 millimeters, were then removed from the polygon, and subsequently formulated into thin film transistor arrays by photodelineation processes, and subsequent metallization for a source and drain electrode. The electrical testing of the array revealed a remarkable uniformity of properties in that the off-currents of all the elements was less than 10 pico-amps, and the on-currents all exceeded 2 microamps. The off-currents of all the devices were within 10% of each other and the on-currents were all within 100%.

EXAMPLE II

Six glass substrates of dimensions 5" by 12" with predeposited gate electrode patterns were adhered with clips to a polygon electrode. The apparatus of FIG. 2 was evacuated to pressures of less than $1 \times 10^{-4}$ Torr, and the combined inleak and outgassing rate was typically smaller than 0.1 standard cubic centimeter per minute. The polygon rotation was started at a speed of one rotation per minute, and the polygon with glass substrates was heated up to 250° C. over a period of 30 minutes. Thereafter, a mixture of 5:1 ammonia to silane gas, available from Air Products, was introduced in the apparatus at flow rates of 200 standard cubic centimeters per minute. The roots/mechanical pump combination of the apparatus was throttled so as to produce a pressure of 250 mTorr at this flow rate. The pressure was held constant by a closed loop pressure control apparatus situated between the capacitance manometer and the throttle valve. The discharge was initiated in the annular space situated between the polygon electrode, and a second steel counterelectrode, by applying alternating current of a frequency of 13.56 MHz, and about 300 volts peak to peak amplitude to these electrodes. The average distance between the polygon and the counterelectrode was about 1 inch; the distance between the counterelectrode and the discharge shield was 3 millimeters.

There was deposited after 45 minutes in a thickness of 0.3 microns silicon nitride on the glass substrates. Thereafter, and following the introduction of silane gas, there was deposited on the silicon nitride, amorphous hydrogenated silicon in a thickness of 0.3 microns in 60 minutes. Subsequently, and following the introduction of the 5:1 ammonia-silane gas mixture into the reaction chamber, there was deposited on the amorphous hydrogenated silicon layer in a thickness of 0.3 microns silicon nitride in 45 minutes. The apparatus was then deactivated by turning off the supply voltages and closing the gas valves. Thereafter, the substrates were removed from the polygon. The resulting thin film multilayers, with supporting glass substrates in a thickness of 1.5 millimeters, were then removed from the polygon and subsequently formulated into thin film transistor arrays by photodelineation processes, and subsequent metallization for the source and drain electrode. Electrical testing of the array revealed a remarkable uniformity of properties in that the off-currents of all the 5000 elements was less than 1 pico-amp and the on-currents all exceeded 0.1 microamp. The stability of these devices, upon repeated cycling, was excellent and did not substantially change over a period of 30 days at a switching rate of 30 kHz.

Other modifications of the present invention may occur to those skilled in the art based upon a reading of the present disclosure and these modifications are intended to be included within the scope of the present invention.

What is claimed is:

1. An apparatus for affecting the preparation of thin film transistor arrays comprised of a chamber means with a gas inlet means, and a gas exhaust means, first rotatable polygon electrode means with a substrate means thereon, and second stationary counterelectrode means of cylindrical shape situated coaxially with the first electrode means.

2. An apparatus in accordance with claim 1 wherein means to introduce gases are introduced into a reaction zone between the first and the second electrode means in a crossflow direction perpendicular to the axis of the polygon means through an opening in the second electrode means are present.

3. An apparatus in accordance with claim 2 in which the opening is an elongated slit in the second electrode means parallel to the rotation axis of the polygon electrode means.

4. An apparatus in accordance with claim 1 wherein means to introduce gases are introduced into the reaction zone between the first and the second electrode means in a crossflow direction perpendicular to the axis of the polygon means through openings in the second electrode means followed by the exhaustion of and means to exhaust the unused gases are present.

5. An apparatus in accordance with claim 1 wherein the first polygon electrode means is electrically insulated from ground potential and the second electrode means is electrically grounded.

6. An apparatus in accordance with claim 1 wherein the first polygon electrode means is electrically grounded and the second electrode means is electrically insulated from ground potential.

7. An apparatus in accordance with claim 6 wherein the second electrode means is surrounded by and coaxial with a grounded shield.

8. An apparatus in accordance with claim 7 wherein the grounded shield contains gas inlet and exhaust openings which are oriented parallel to the rotational axis of the polygon first electrode means.

9. An apparatus in accordance with claim 1 wherein the inside of the first polygon electrode means is not in contact with the partial vacuum in the chamber means.

10. An apparatus in accordance with claim 7 wherein radiant heating elements are contained within the first polygon electrode means.

11. An apparatus in accordance with claim 1 wherein means to introduce gases are introduced into the chamber means at reduced pressure at a rate of from about 20 standard cubic centimeter per minute to about 1 standard cubic liter per minute are present.

12. An apparatus in accordance with claim 1 wherein the polygon is comprised of stainless steel or aluminum.

13. An apparatus in accordance with claim 1 wherein a plurality of first and second electrode means are contained in the chamber means.

14. A process for preparing thin film multilayers which comprises providing a vaccum chamber, containing therein a first polygon electrode means with substrates thereon, and a second counterelectrode means; heating the polygon means with heating elements contained therein; causing the polygon electrode means to axially rotate; introducing gases into the chamber means at a crossflow direction with respect to the polygon means; applying electrical power to the first and second electrode means whereby the gases are decomposed enabling deposition thereof on the substrates of the polygon means.

15. A process in accordance with claim 14 wherein the first polygon electrode means is electrically powered by an alternating voltage power supply, whereas the second counterelectrode means is electrically grounded.

16. A process in accordance with claim 14 wherein the second counterelectrode means is electrically powered by an alternating voltage power supply.

17. A process in accordance with claim 15 wherein organosilanes and silane gases are introduced sequentially into the chamber means.

18. A process in accordance with claim 14 wherein the gases aluminum trichloride, nitrous oxide, and silane are introduced into the chamber means.

19. An apparatus in accordance with claim 1 wherein the polygon contains thereon facets.

20. An apparatus in accordance with claim 19 wherein the facets of the polygon have a width of 6 inches and a length of 17 inches.

21. An apparatus in accordance with claim 1 further including on the substrate means a coating thereover.

22. An apparatus for affecting the preparation of thin film transistor arrays consisting essentially of a chamber means with a gas inlet means, and a gas exhaust means; first rotatable polygon electrode means with a substrate means thereon; second stationary counterelectrode means of cylindrical shape situated coaxially with the first electrode means; said polygon means being comprised of facets, and wherein gases are introduced into a reaction zone between the first and second electrode means in a crossflow direction perpendicular to the axis of the polygon means through an opening in the second electrode means are present.

23. A process for preparing thin film multilayers consisting essentially of providing a vacuum chamber containing therein a first polygon electrode means with substrates thereon; and a second counterelectrode means; heating the polygon means to a temperature of from about 100° C. to about 500° C. with heating elements contained therein; causing the polygon electrode means to axially rotate with a power source; introducing means to introduce gases into the chamber means at a crossflow direction with respect to the polygon means; and applying electrical power to the first and second electrode means whereby the gases are decomposed enabling deposition thereof on the substrate of the polygon means.

24. A process in accordance with claim 14 wherein there is selected silane gases resulting in the deposition of hydrogenated amorphous silicon.

25. A process in accordance with claim 14 wherein there is introduced sequentially into the chamber means gases selected from the group consisting of silane, and ammonia and silane.

26. A process in accordance with claim 14 wherein the gases silane and nitrous oxide and silane are introduced sequentially into the chamber means.

* * * * *